(12) United States Patent
Yow et al.

(10) Patent No.: US 9,165,855 B1
(45) Date of Patent: Oct. 20, 2015

(54) SEMICONDUCTOR DEVICE WITH DIE ATTACHED HEAT SPREADER

(71) Applicants: Kai Yun Yow, Petaling Jaya (MY); Poh Leng Eu, Petaling Jaya (MY)

(72) Inventors: Kai Yun Yow, Petaling Jaya (MY); Poh Leng Eu, Petaling Jaya (MY)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/321,826

(22) Filed: Jul. 2, 2014

(51) Int. Cl.
  *H01L 23/28* (2006.01)
  *H01L 23/367* (2006.01)
  *H01L 23/495* (2006.01)
  *H01L 23/31* (2006.01)
  *H01L 23/00* (2006.01)
  *H01L 21/56* (2006.01)

(52) U.S. Cl.
  CPC .......... *H01L 23/3675* (2013.01); *H01L 21/565* (2013.01); *H01L 23/3107* (2013.01); *H01L 23/49503* (2013.01); *H01L 24/27* (2013.01); *H01L 24/32* (2013.01); *H01L 24/83* (2013.01); *H01L 2224/2731* (2013.01); *H01L 2224/32245* (2013.01); *H01L 2224/8385* (2013.01); *H01L 2224/8389* (2013.01); *H01L 2924/14* (2013.01)

(58) Field of Classification Search
  CPC ........................................ H01L 23/36
  USPC ................... 257/796, 675, 706, 713, E23.101
  See application file for complete search history.

(56) References Cited

U.S. PATENT DOCUMENTS

| | | | |
|---|---|---|---|
| 4,479,140 A * | 10/1984 | Horvath | 257/713 |
| 5,012,386 A | 4/1991 | McShane et al. | |
| 5,504,652 A | 4/1996 | Foster et al. | |
| 5,656,864 A * | 8/1997 | Mitsue et al. | 257/787 |
| 6,538,321 B2 * | 3/2003 | Huang et al. | 257/706 |
| 6,580,167 B1 | 6/2003 | Glenn et al. | |
| 6,706,563 B2 * | 3/2004 | Shim et al. | 438/125 |
| 7,190,066 B2 * | 3/2007 | Huang et al. | 257/704 |
| 7,361,985 B2 | 4/2008 | Yuan et al. | |
| 7,892,882 B2 | 2/2011 | Leal et al. | |
| 8,049,313 B2 | 11/2011 | Foong et al. | |
| 8,395,254 B2 | 3/2013 | Espiritu et al. | |
| 8,643,172 B2 | 2/2014 | Foong et al. | |
| 8,674,509 B2 | 3/2014 | Carpenter et al. | |
| 2005/0093135 A1* | 5/2005 | Liu | H01L 23/4334 257/707 |
| 2005/0104195 A1* | 5/2005 | Yang | H01L 23/3128 257/706 |
| 2006/0170094 A1 | 8/2006 | Subramanian et al. | |
| 2007/0090502 A1* | 4/2007 | Zhao et al. | 257/675 |
| 2007/0114677 A1* | 5/2007 | Kwon | H01L 21/4871 257/796 |
| 2013/0037931 A1 | 2/2013 | Higgins, III | |
| 2014/0061894 A1 | 3/2014 | Chopin | |

* cited by examiner

*Primary Examiner* — Nitin Parekh
(74) *Attorney, Agent, or Firm* — Charles E. Berrgere

(57) ABSTRACT

A packaged semiconductor device has an integrated circuit (IC) die and a heat spreader. The heat spreader has a first portion with holes formed entirely therethrough. The first portion is attached to the die using thermally-conductive adhesive that fills the holes. The holes enable the heat spreader to be attached to the die without placing excess pressure on the IC die that could cause the die to crack.

7 Claims, 4 Drawing Sheets

CROSS-SECTION B-B

CROSS-SECTION A-A

CROSS-SECTION B-B

SEMICONDUCTOR DEVICE WITH DIE ATTACHED HEAT SPREADER

BACKGROUND

The present invention relates generally to semiconductor packaging, and more particularly, to assembling a semiconductor device with a heat spreader attached to the integrated circuit die.

It is well known that integrated circuits, especially high power integrated circuits generate heat. If too much heat is generated and such heat is not adequately dissipated, then the integrated circuit could overheat, resulting in decreased performance and possibly even failure. To help dissipate heat, a packaged semiconductor device may include a heat spreader such as a thermal slug. In general, a heat spreader disperses heat emitted from an integrated circuit to an area of the package that is away from the integrated circuit. However, while heat spreaders are important, if they are attached directly to the die, the attachment force can crack the die and damage the integrated circuit. Accordingly, it would be advantageous to be able to attach a heat spreader to a die without damaging the die.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

In the following description, it will be understood that certain embodiments of the present invention are related to the mounting of heat spreaders within packaged semiconductor devices. For ease of discussion, the mounting of one exemplary heat spreader within one exemplary packaged semiconductor device is described below. However, it will be understood that embodiments of the present invention are not limited to the particular heat spreader design or the particular packaged semiconductor device described below.

In one embodiment of the present invention, a packaged semiconductor device comprises an integrated circuit (IC) die and a heat spreader. The heat spreader comprises a first portion having a plurality of holes formed entirely therethrough. Thermally-conductive adhesive fills the holes to attach the heat spreader to the IC die. In another embodiment, the present invention is a method of assembling the aforementioned packaged semiconductor device.

FIGS. 1-4 illustrate various steps of assembling a packaged semiconductor device according to one embodiment of the present invention. In this embodiment, the packaged semiconductor device is implemented as a quad-flat package (QFP).

Figure 1A:
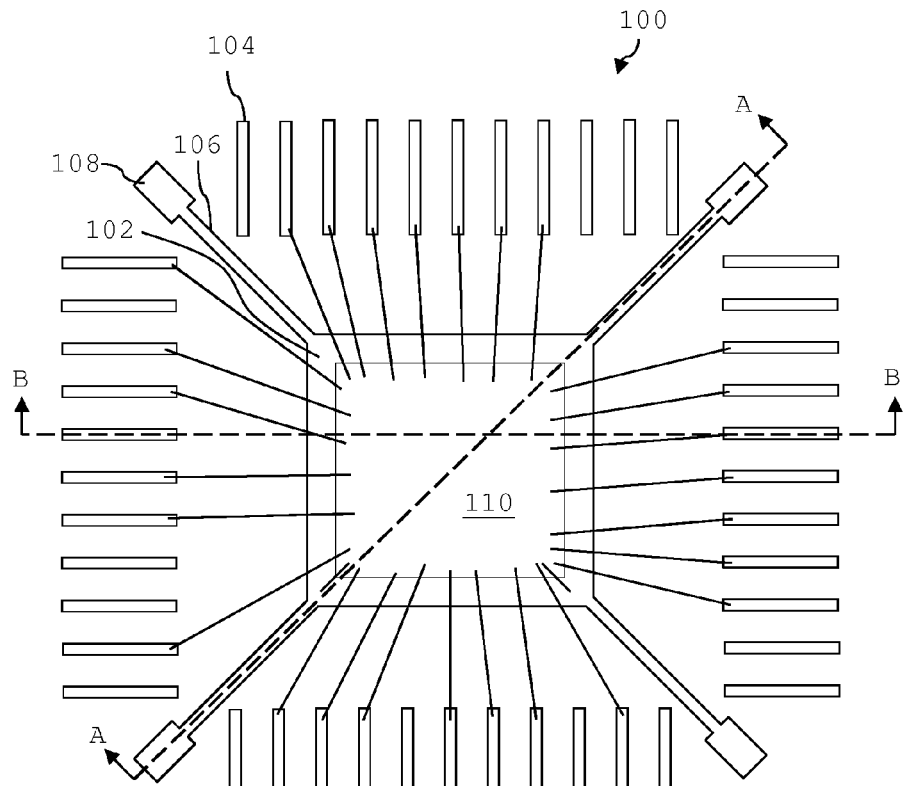
FIGS. 1A-1C respectively show a top view and two cross-sectional side views of a partially-assembled semiconductor package after die attachment and wire bonding according to one embodiment of the present invention.
Figure 1B:
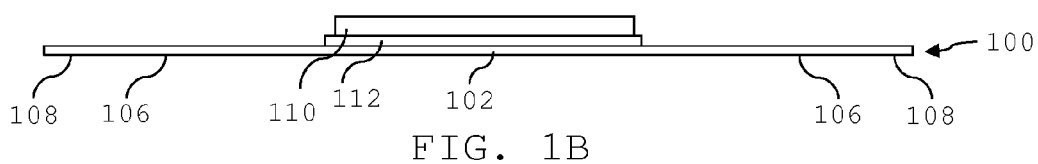
Figure 1C:
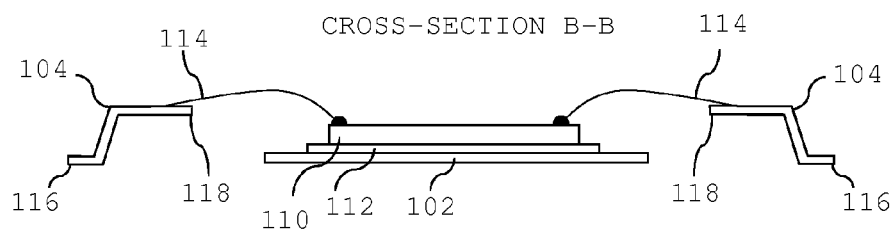

Referring now to FIGS. 1A-1C, a top view and two cross-sectional side views of a partially-assembled semiconductor package after die attachment and wire bonding are shown, respectively. The partially-assembled semiconductor package comprises a metal lead frame 100 and an integrated circuit (IC) die 110. Methods of fabricating the lead frame 100 and the die 110 are well known and therefore not described herein.

The lead frame 100 comprises a rectangular-shaped die paddle 102 (sometimes referred to as a die flag or pad) with four tie bars 106 extending therefrom. Each tie bar 106 extends diagonally from a corner of the die paddle 102 to a periphery of the lead frame 100, and each tie bar 106 has a pad 108 formed at the end thereof.

The lead frame 100 also comprises a plurality of lead fingers 104 that surround the die paddle 102 along the periphery of the lead frame 100. As shown in cross-sectional view B-B of FIG. 1C, each lead finger 104 has a distal end 116 and a proximal end 118. Each distal end 116 lies on substantially the same plane as the die paddle 102, and each lead finger 104 is bent such that its proximal end 118 lies on a plane above the plane of the die paddle 102.

Although not shown, for the partially-assembled semiconductor package of FIG. 1, the lead frame 100 may comprise metal connecting elements (sometimes referred to as lead frame runners) that connect the distal ends 116 of the lead fingers 104 to one another and to the tie bars 106. These metal connecting elements may also connect the lead frame 100 to one or more other instances (not shown) of the lead frame 100 such that the instances of lead frames form an array of interconnected lead frames.

To assemble the packaged semiconductor device, the IC die 110 is mounted onto the die paddle 102 using a die-attach adhesive 112 as shown in cross-sectional views A-A and B-B of FIGS. 1B and 1C, respectively. Bond wires 114 are then strung between bond pads (not shown) on the IC die 110 and a plurality of the lead fingers 104.

Figure 2A:
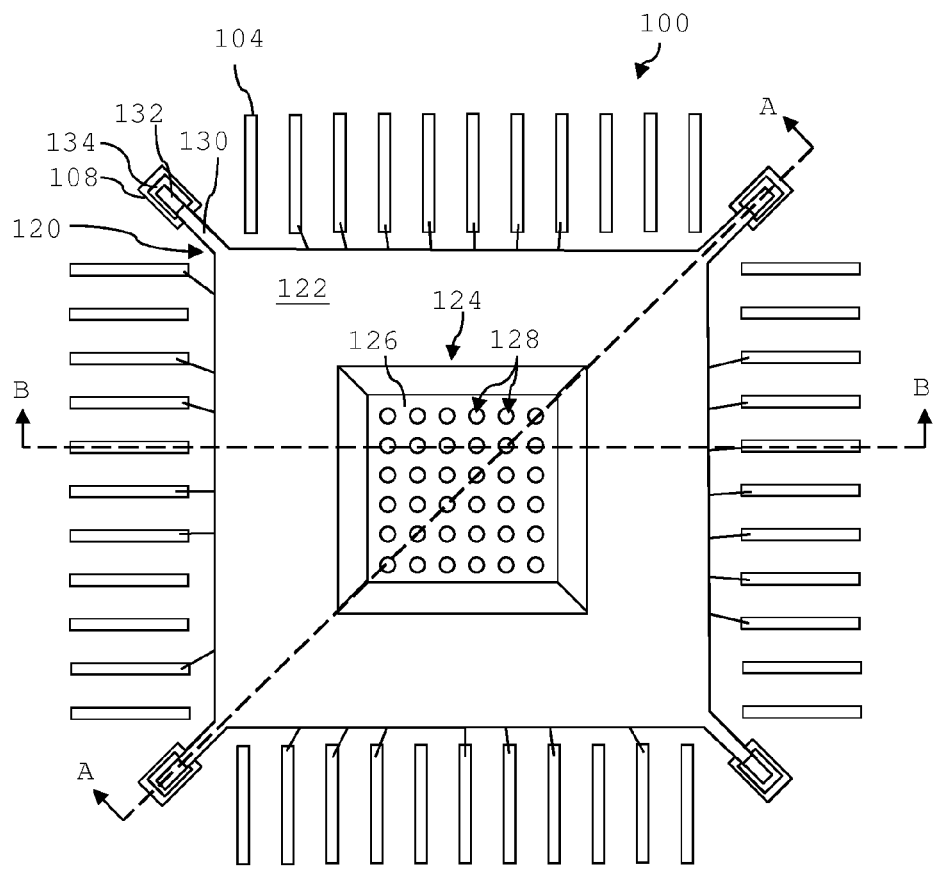
FIGS. 2A-2C respectively show a top view and two cross-sectional side views of the partially-assembled semiconductor package of FIGS. 1A-1C with a heat spreader attached thereto according to one embodiment of the present invention.
Figure 2B:
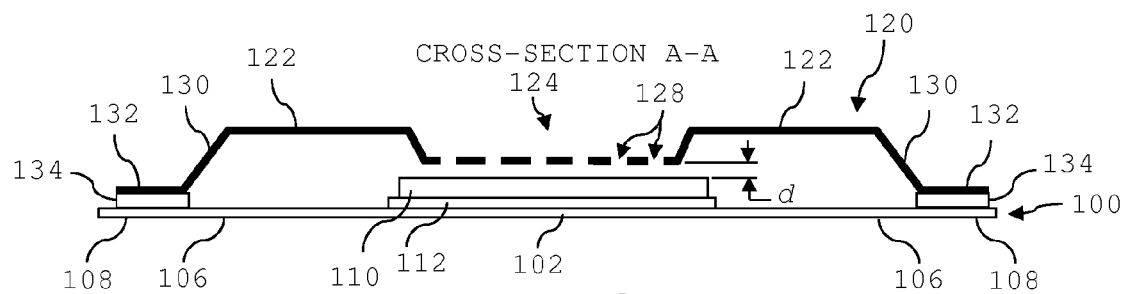
Figure 2C:
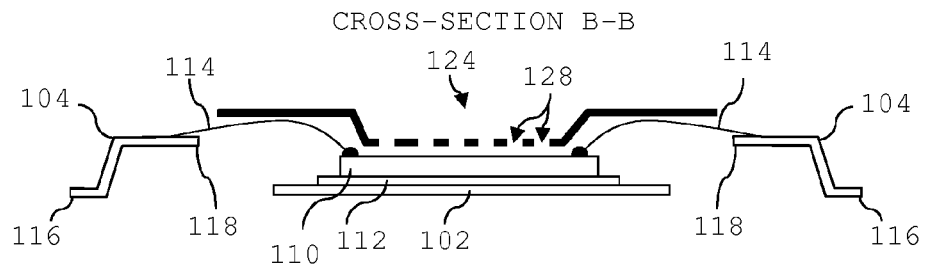

FIGS. 2A-2C respectively show a top view and two cross-sectional side views of the partially-assembled semiconductor package of FIGS. 1A-1C with a heat spreader 120 attached thereto. The heat spreader 120, which may be fabricated from a metal, an alloy, or any suitable thermally-conductive material, comprises a substantially rectangular, outer portion 122 having a substantially rectangular, recessed, inner portion 124 formed therein. The inner portion 124 has a plurality of cylindrical holes 128 formed entirely therethrough.

To mount the heat spreader 120 on the lead frame 100, the heat spreader 120 comprises four angled legs 130. Each leg 130 extends at a downward angle from a different corner of the outer portion 122 and has a foot 132 formed at the end thereof. The heat spreader 120 is mounted on the lead frame 100 by adhering each foot 132 to a different tie-bar pad 108 of the lead frame 100 using an adhesive 134.

The length and angle of each leg 130 is selected such that, when the heat spreader 120 is mounted onto the lead frame 100, the outer portion 122 of the heat spreader 120 does not interfere with the bond wires 114. Further, the depth of the recessed inner portion 124 is selected such that, when the heat spreader 120 is mounted onto the lead frame 100, the bottom of the inner portion 124 is a desired distance d above the top of the IC die 110.

In this embodiment, the distance d is selected to be large enough that the heat spreader 120 does not contact the top of the IC die 110 and small enough that heat spreader 120 provides sufficient heat removal. Leaving a gap between the top of the IC die 110 and the heat spreader 120, ensures that the heat spreader 120 does not put unnecessary pressure on the top of the IC die 110 during mounting, which could result in cracking of the IC die 110.

Figure 3A:
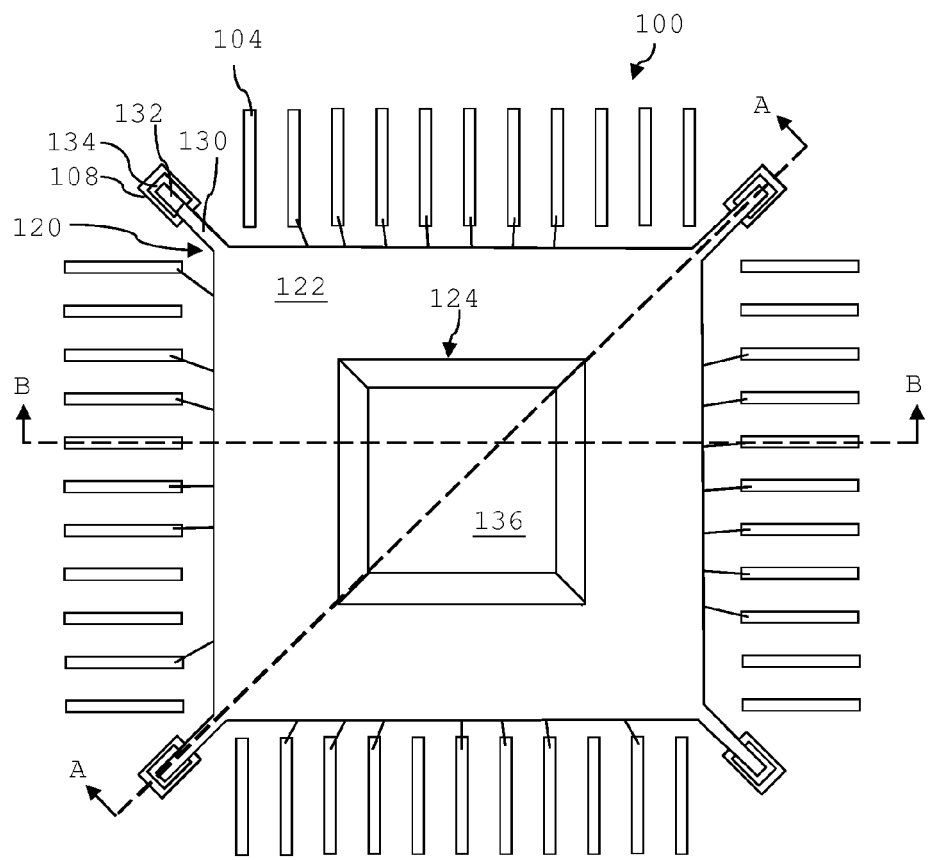
FIGS. 3A-3C respectively show a top view and two cross-sectional side views of the partially-assembled semiconductor package of FIGS. 2A-2C with a thermally-conductive adhesive applied thereto according to one embodiment of the present invention.
Figure 3B:
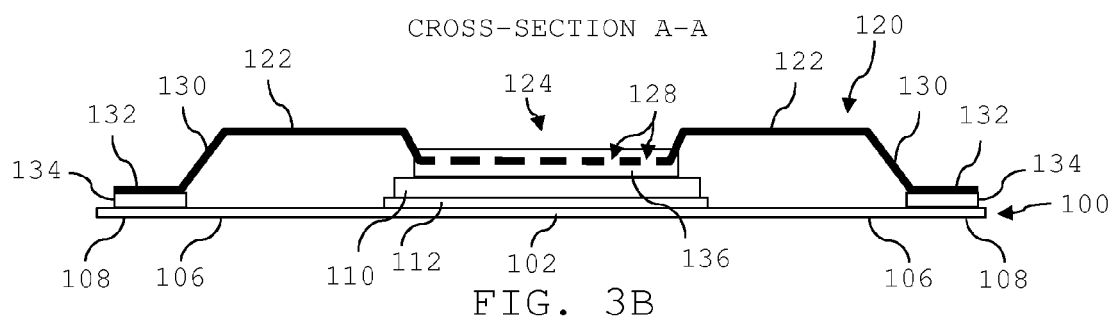
Figure 3C:
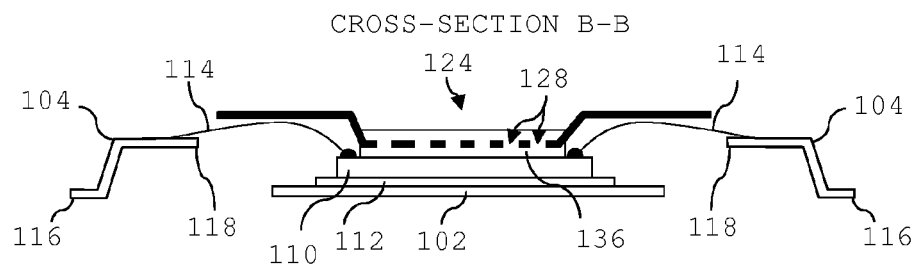

FIGS. 3A-3C respectively show a top view and two cross-sectional side views of the partially-assembled semiconductor package of FIGS. 2A-2C with a thermally-conductive adhesive 136 applied thereto. The thermally-conductive adhesive 136 may be, for example (without limitation) a thermally-conductive epoxy, and, in some embodiments of the present invention, may comprise silver or other metal particles to enhance thermal conductivity. Further, the thermally-conductive adhesive 136 may be dispensed into the recessed inner portion 124 using, for example, a high precision, volume-controlled, nozzle dispenser (not shown) to prevent the adhesive 136 from overflowing onto the bond wires 114. After dispensing, the adhesive 136 is subsequently cured.

As shown in cross-sectional views A-A and B-B of FIGS. 3B and 3C, respectively, the thermally-conductive adhesive 136 flows through the holes 128 to fill the space between the top of the IC die 110 and the bottom of the inner portion 124. The thermally-conductive adhesive 136 also fills the holes 128 and a portion of the recess formed by the inner portion 124. In this configuration, heat transfers from the IC die 110 through the thermally-conductive adhesive 136 to the heat spreader 120.

Note that the thermally-conductive adhesive 136 does not contact the bond wires 114 or the bond pads (not shown) on the upper surface of the IC die 110. This may be accomplished by, for example, selecting an adhesive having a viscosity and surface tension that restricts the adhesive from flowing toward the bond wires 114 and bond pads.

Figure 4A:
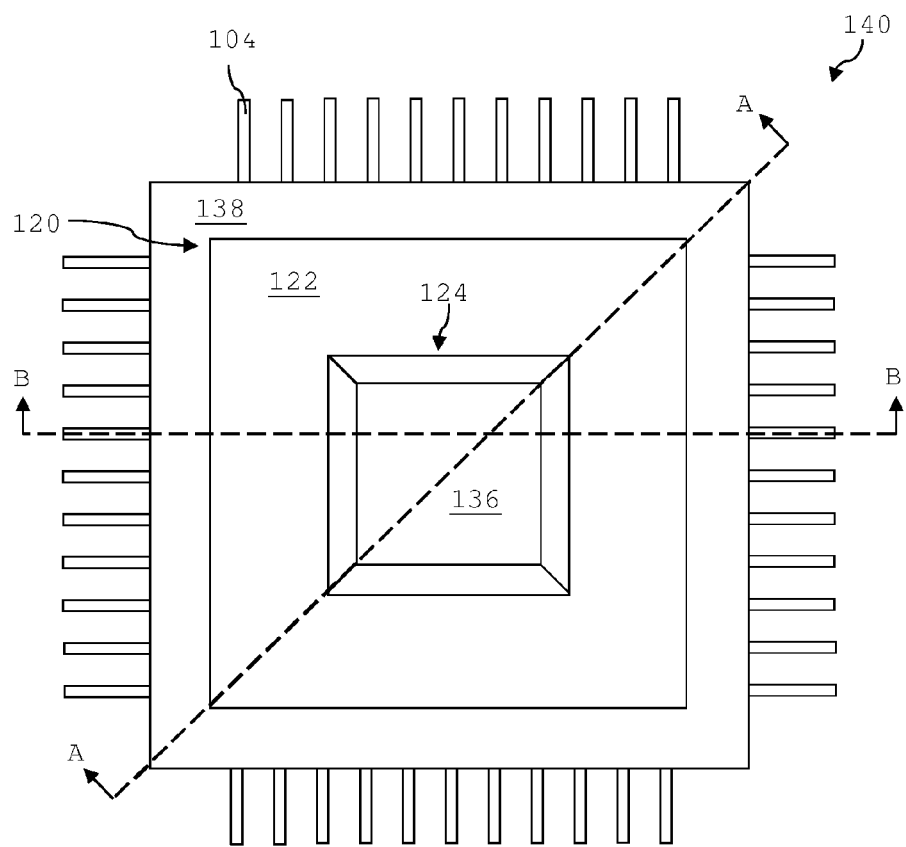
FIGS. 4A-4C respectively show a top view and two cross-sectional side views of a fully-assembled packaged semiconductor device according to one embodiment of the present invention.
Figure 4B:
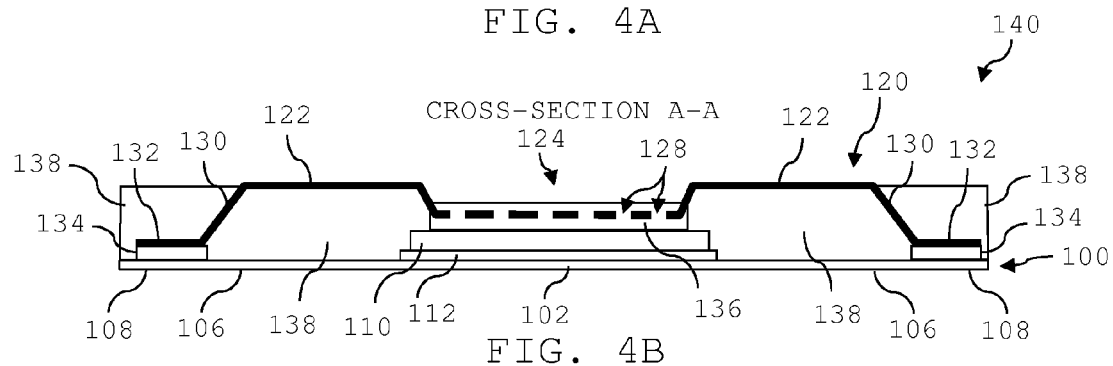
Figure 4C:
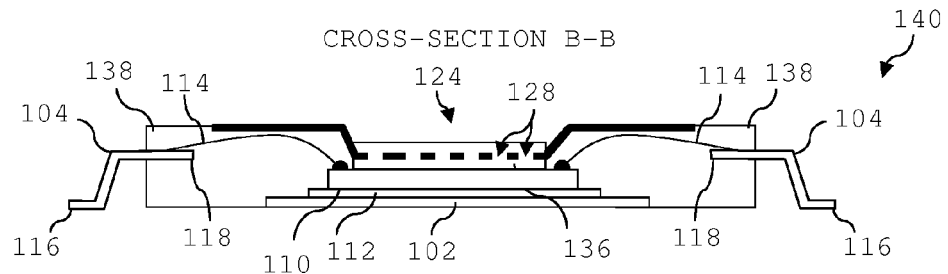

FIGS. 4A-4C respectively show a top view and two cross-sectional side views of a fully-assembled packaged semiconductor device 140 according to one embodiment of the present invention. Packaged semiconductor device 140 is completed by applying molding compound 138 to the partially-assembled semiconductor package of FIGS. 3A-3C. The molding compound 138, which may be applied via the nozzle of a conventional dispensing machine (not shown), encases the legs 130 and feet 132 of the heat spreader 120 (and the area between each adjacent pair of legs 130 and feet 132), the bond wires 114, the proximal ends 118 of the lead fingers 104, the exposed portion of the IC die 110, and the exposed upper surface of the die paddle 102 and tie bars 106. Further, although not shown, the molding compound 138 may optionally fill the remainder of the recess formed by inner portion 124 above the thermally-conductive adhesive 136.

The molding compound 138 does not cover the top of the outer portion 122. Rather, the top of the outer portion 122 is exposed to the ambient environment above the packaged semiconductor device 140 to enhance heat dissipation. In addition, although not shown, heat dissipation can be further enhanced by mounting a heat slug to the top of outer portion 122.

After molding, laser or saw singulation and/or trimming may be performed to remove any metal connecting elements (not shown) to (i) electrically and mechanically de-couple the lead fingers 104 from one another and from the tie bars 106 and (ii) separate the packaged semiconductor device 140 from other packaged semiconductor devices assembled on adjacent, interconnected lead frames (not shown).

Although one embodiment of the present invention was described relative to its use with a QFP having a particular configuration, embodiments of the present invention are not so limited. According to alternative embodiments, heat spreaders of the present invention may be mounted within QFPs having configurations other than that shown and within other types of packages including (without limitation) packages that have balls or pins and packages that electrically connect IC dies to leads without using bond wires (e.g., using redistribution layers located below the IC dies).

Further, although one embodiment of the present invention was shown in which the heat spreader 120 has a recess, inner portion 124 formed therein, embodiments of the present invention are not so limited. According to alternative embodiments, heat spreaders of the present invention may be implemented without recesses. For example, the outer and inner portions 122 and 124 of heat spreader 120 in FIGS. 2A-2C may be co-planar.

As another example, instead of having a recessed and relatively thin inner portion 124, embodiments of the present invention may be implemented with a non-recessed, thick inner portion whose thickness is substantially equal to the vertical distance from the top of outer portion 122 to the bottom of inner portion 124. This thick inner portion would still have holes formed entirely through.

According to further embodiments of the present invention, heat spreaders may have shapes other than that shown. For example, heat spreaders of the present invention may have upper surfaces that have circular or hexagonal outer shapes rather than the rectangular outer shape of outer portion 122 of heat spreader 120. As another example, heat spreaders of the present invention may have different numbers of legs than that shown, including a single leg, and may have legs that are in different positions and/or configurations than that shown. As yet another example, heat spreaders of the present invention may have different configurations of holes for receiving the thermally-conductive adhesive, including different numbers of holes, differently-shaped holes, and differently-arranged holes.

According to yet further embodiments of the present invention, the thermally-conductive adhesive can be applied to one or more of the IC die and the heat spreader before the heat spreader is mounted onto the IC die. In such embodiments, the heat spreader and IC die are adhered to one another by pressing the heat spreader and IC die together.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A packaged semiconductor device, comprising:
   an integrated circuit (IC) die;
   a heat spreader comprising a first portion having a plurality of holes formed entirely therethrough, and an outer portion, wherein the first portion is a recessed inner portion formed within the outer portion, wherein a vertical distance between a bottom surface of the first portion and a plane of the IC die is less than a vertical distance between the outer portion and the plane of the IC die; and
   thermally-conductive adhesive that fills the holes to attach the heat spreader to the IC die.

2. The packaged semiconductor device of claim 1, wherein the thermally-conductive adhesive fills at least some of the recessed inner portion.

3. The packaged semiconductor device of claim 1, wherein the heat spreader comprises one or more legs extending therefrom that prevent the first portion from contacting the IC die.

4. The packaged semiconductor device of claim 3, wherein the packaged semiconductor device comprises:
   at least one of a substrate and a lead frame; and
   an adhesive that attaches the one or more legs of the heat spreader to the at least one of the substrate and the lead frame.

5. The packaged semiconductor device of claim 4, wherein:
   the packaged semiconductor device comprises a lead frame that comprises a die paddle having one or more tie bars extending therefrom; and
   the one or more legs of the heat spreader are mounted onto the one or more tie bars.

6. The packaged semiconductor device of claim 3, wherein:
   the heat spreader comprises two or more legs extending therefrom; and
   the packaged semiconductor device comprises a molding compound between adjacent legs.

7. The packaged semiconductor device of claim 1, wherein the thermally-conductive adhesive fills a space between the first portion and the IC die.

\* \* \* \* \*